US007675165B2

(12) United States Patent
Heberle et al.

(10) Patent No.: US 7,675,165 B2
(45) Date of Patent: Mar. 9, 2010

(54) MOUNT FOR A PROGRAMMABLE ELECTRONIC PROCESSING DEVICE

(75) Inventors: Klaus Heberle, Reute (DE); Ulrich Sieben, Reute (DE)

(73) Assignee: Micronas GmbH, Freiburg (DE)

( * ) Notice: Subject to any disclaimer, the term of this patent is extended or adjusted under 35 U.S.C. 154(b) by 169 days.

(21) Appl. No.: 11/584,377

(22) Filed: Oct. 20, 2006

(65) Prior Publication Data
US 2007/0035018 A1 Feb. 15, 2007

Related U.S. Application Data

(63) Continuation of application No. 10/471,467, filed on Nov. 4, 2004, now Pat. No. 7,138,712.

(51) Int. Cl.
| | |
|---|---|
| H01L 23/34 | (2006.01) |
| H01L 23/495 | (2006.01) |
| H01L 23/02 | (2006.01) |
| H01L 23/48 | (2006.01) |
| H01L 23/52 | (2006.01) |
| H01L 29/40 | (2006.01) |

(52) U.S. Cl. .................. 257/723; 257/676; 257/685; 257/773; 257/776; 257/E23.142; 257/E23.151; 257/E23.169; 257/E23.175

(58) Field of Classification Search .................. 257/676, 257/685, 723, 773, 776, E23.142, E23.151, 257/E23.169, E23.175
See application file for complete search history.

(56) References Cited

U.S. PATENT DOCUMENTS

| 4,172,261 | A | | 10/1979 | Tsuzuki et al. ............... 257/717 |
|---|---|---|---|---|
| 5,245,216 | A | * | 9/1993 | Sako ........................... 257/676 |
| 5,408,127 | A | * | 4/1995 | Mostafazadeh ............. 257/676 |
| 5,451,814 | A | * | 9/1995 | Yoshimizu ................... 257/685 |
| 5,552,966 | A | * | 9/1996 | Nagano ....................... 361/813 |
| 5,598,038 | A | * | 1/1997 | Sugano ........................ 257/787 |
| 5,640,044 | A | * | 6/1997 | Takehashi et al. ........... 257/666 |

(Continued)

FOREIGN PATENT DOCUMENTS

JP 11-111913 4/1999

(Continued)

*Primary Examiner*—Ida M Soward
(74) *Attorney, Agent, or Firm*—O'Shea Getz P.C.

(57) ABSTRACT

A processing device embodied in an integrated circuit may be divided into first and second functional units. A mount for the integrated circuit may be assigned to the first functional unit, which may define the external electrical connections of the processing device. Processing may take place in a second functional unit of the processing device, whose essential connections may normally be accessible from the outside via the external connections of the first functional unit. The processor device having first and second functional units in a mount may be similar to a hybrid circuit but may serve a different purpose. The first functional unit, which may also comprise more than one monolithic integrated circuit, may define the external connections and may make available suitable matching circuits for the second functional unit. In this manner, the processing device, which may be contained in the second functional unit and may also comprise more than one monolithic integrated circuit, may be considered to be "masked" as viewed from the outside. In addition to the matching circuits, the first functional unit may contain subcircuits performing more general functions, such as oscillators, supply voltage regulator circuits, buffer circuits, protective circuits, etc.

18 Claims, 3 Drawing Sheets

U.S. PATENT DOCUMENTS

| | | | | |
|---|---|---|---|---|
| 5,715,147 | A * | 2/1998 | Nagano | 361/813 |
| 5,726,500 | A | 3/1998 | Duboz et al. | 257/777 |
| 5,767,576 | A * | 6/1998 | Kobayashi et al. | 257/701 |
| 5,965,947 | A * | 10/1999 | Nam et al. | 257/783 |
| 6,054,900 | A | 4/2000 | Ishida et al. | 330/286 |
| 6,097,097 | A | 8/2000 | Hirose | 257/778 |
| 6,185,280 | B1 * | 2/2001 | Jarboe et al. | 379/3 |
| 6,222,213 | B1 | 4/2001 | Fujiwara | 257/210 |
| 6,316,840 | B1 | 11/2001 | Otani | 257/787 |
| 6,388,319 | B1 * | 5/2002 | Cheah et al. | 257/723 |
| 6,396,130 | B1 * | 5/2002 | Crowley et al. | 257/666 |
| 6,521,994 | B1 * | 2/2003 | Huse et al. | 257/724 |
| 6,528,868 | B1 * | 3/2003 | Weiblen et al. | 257/669 |
| 6,633,005 | B2 | 10/2003 | Ichitsubo et al. | 174/260 |
| 6,847,262 | B2 | 1/2005 | Ichitsubo et al. | 330/307 |
| 6,871,413 | B1 | 3/2005 | Arms et al. | 33/366.11 |
| 2001/0030361 | A1 * | 10/2001 | Gabara et al. | 257/685 |
| 2002/0093094 | A1 * | 7/2002 | Takagawa et al. | 257/723 |
| 2003/0005191 | A1 | 1/2003 | Montierth et al. | 710/104 |
| 2003/0005767 | A1 | 1/2003 | Hulsing, II | 73/514.02 |

FOREIGN PATENT DOCUMENTS

| | | |
|---|---|---|
| JP | 11-354643 | 12/1999 |
| WO | WO 93/14409 | 7/1993 |

* cited by examiner

MOUNT FOR A PROGRAMMABLE ELECTRONIC PROCESSING DEVICE

PRIORITY INFORMATION

This application is a continuation of U.S. Pat. No. 7,138,712 issued on Nov. 21, 2006.

BACKGROUND OF THE INVENTION

This invention relates in general to integrated circuits, and in particular to a mount for a programmable electronic processing device.

Processing devices may constitute a processor which comprises at least one structure in the form of a monolithic integrated circuit. Both analog and digital signals or data may be processed, depending on the application. The relatively small electronic processor modules allow the processors to be housed along with additional circuits, such as memories, in a relatively small package. The relatively small package dimensions are a characteristic of microprocessors. If at least two individual structures are contained in a mount, this may be referred to as a hybrid circuit, as distinguished from those cases where only a single monolithic integrated circuit may be present.

The use of microprocessors is increasing in all areas of technology, since they readily lend themselves to embodiments of various control processes. The cost and complexity of microprocessors is relatively low, and they allow for decentralized solutions. A wide range of microprocessor applications is in mechanical engineering, particularly in the automotive field, which is increasingly resorting to microprocessors to improve the behavior of various vehicle systems, subsystems and components.

In many cases where such processors can be used, however, a basic problem arises from the fact that the technology life cycle times may differ widely for the manufacturer and user of the processors. When such processors are adopted for use in a technical system, as uniform a product as possible should be available not only for the manufacture but also for replacement throughout the development, planning, fabrication, and operating lifetimes of the associated system.

In the event of a technology change, aside from the changes in electrical connection parameters, the potentially changed sensitivities to overvoltages, polarity reversals, and electromagnetic interference have to be taken into account. There are also changes in the interfering effect on other circuits, for example by steeper clock-pulse and data edges which travel as electromagnetic interference signals over relatively long lines.

The pace of development in semiconductor technology is generally ahead of the time frame specified by the user, primarily because the development must follow then-current technology changes to be able to implement increasingly complex circuits. The continued use of obsolete technologies involves the use of parallel production lines, which are usually uneconomical because full capacity utilization is not ensured.

What is needed is a mount for a processing device which enables the semiconductor manufacturer, on the one hand, to use state-of-the-art semiconductor processes and, on the other hand, to allow the product to be used for a relatively long time.

SUMMARY OF THE INVENTION

A mount and a processing device may be somewhat dependent, since the mount may be assigned a first functional unit of the processing device. As such, the first functional unit may define the external electrical connections of the processing device. Processing may take place in a second functional unit of the processing device, whose essential connections may normally be accessible from the outside via the external connections of the first functional unit. The term "essential connections" as used herein may be understood to include those connections which, as seen from outside, may be relatively critical in terms of their electrical parameters because their tolerances are tight or because their active or passive disturbance behavior has to be taken into account. Relatively uncritical connections, such as set or reset inputs, may be included but need not necessarily be routed via the first functional unit, even though doing so may be safer in the long run in view of the foreseeable development of the technology used.

The processor device arrangement comprising first and second functional units in a mount may be similar to a hybrid circuit but may serve a different purpose. The first functional unit, which may also comprise more than one monolithic integrated circuit, may define the external connections and may make available suitable matching circuits for the second functional unit. In this manner, the processing device, which may be contained in the second functional unit and may also comprise more than one monolithic integrated circuit, may be considered to be "masked" as viewed from the outside. In addition to the matching circuits, the first functional unit may contain subcircuits performing more general functions, such as oscillators, supply voltage regulator circuits, buffer circuits, protective circuits, etc. The supply voltage regulator circuits may permit autonomous operation of the microprocessor in a supply system with an unregulated or excessive supply voltage. This may be important for operation of the second functional unit, whose supply voltage may be adapted to the technology used, while, on the other hand, the original supply voltage may be retained for other electronic circuits or measuring devices. Since the processing device may also contain memory devices, the write and erase voltages of the memory devices may also be advantageously generated or adapted in the first functional unit.

The division of the processing device into first and second functional units may allow a further technological development of the processing device without having to be taken into account from the outside, provided the technology is retained for the first functional unit. Further developments of the technology may generally be associated with higher processing rates and lower voltage levels. Over the relatively long leads, the processing rates increase the interference potential to be taken into account. On the other hand, the higher processing rates permit sequential processing for many processes for which parallel processing may have been previously necessary because of the lower processing speed. Parallel processing generally necessitates parallel data inputs and outputs, whereby the number of contact pads, and thus the amount of chip area required, is increased. Thus, it may be necessary, despite the increasing functionality of the processors, not to let the number of contact pads increase in proportion thereto, but to limit the increase. Accordingly, serial data input and output may be desirable in the second functional unit. This, however, may require suitable conversion devices in the first functional unit.

If the matching circuits are not fixed, but instead are programmable, the flexibility may be even greater, since adaptation may then be possible via a program. If the input and output levels of the processor change because a new technology is used, the new voltage levels of the matching circuits may be adapted via the program.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
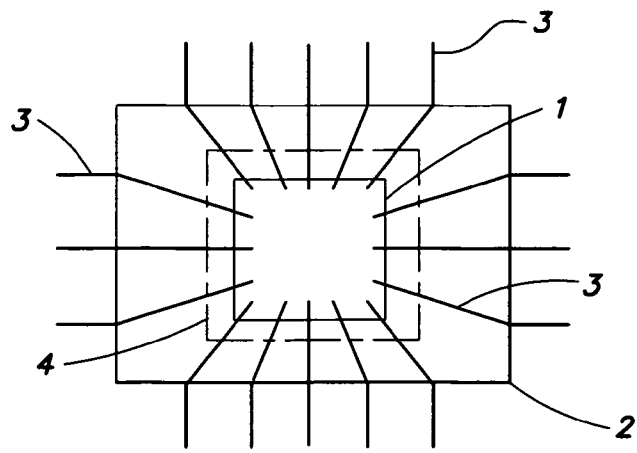
FIG. 1 is a plan view of a typical mount for a monolithic integrated circuit according to the prior art.

Referring to FIG. 1, a monolithic integrated circuit 1 in a mount according to the prior art may have the mount comprise a molded plastic package 2. The carrier of the monolithic integrated circuit 1 may be a flat metal stamping or frame 3, which may provide the connections for the contact pads of the monolithic integrated circuit 1 through the plastic package 2. The frame 3 may also include a platform 4 for receiving the monolithic integrated circuit 1. The platform 4 may be connected to an external ground pin. The contact pads of the monolithic integrated circuit 1 may be connected to the associated inner leads of the frame 3 by bond wires. All of the external leads to the monolithic integrated circuit 1 may be run via the frame 3.

Figure 2:
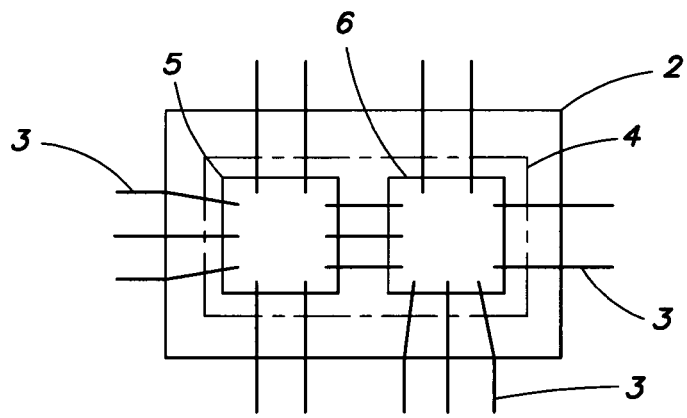
FIG. 2 is a plan view of a typical mount for a hybrid circuit according to the prior art.

Referring to FIG. 2, a prior art hybrid circuit may comprise two monolithic integrated circuits 5, 6. As in FIG. 1, the carrier may be a frame 3 with a platform 4, and the two monolithic integrated circuits 5, 6 may be arranged side by side on the platform 4. Contact may be made to the monolithic integrated circuits 5, 6 via wire bonds which may run either to the associated leads of the frame 3 or directly from circuit to circuit. In some cases, use may be made of a stacked structure, in which a smaller circuit may be cemented onto a larger circuit. The smaller circuit may generally be a memory circuit or a circuit with specific components, such as capacitors, coils, filters, etc.

Hybrid circuits may usually be employed where subcircuits with different basic functions interact, for example an analog circuit and a digital circuit, possibly in conjunction with different memory types. In this manner it may also be possible to combine products of different manufacturers. Mounts for hybrid circuits may also be entire printed circuit boards, to which connections may also generally be made by wire bonding. The individual circuits and the wire bonds on the board may then be protected by a plastic enclosure.

Figure 3:
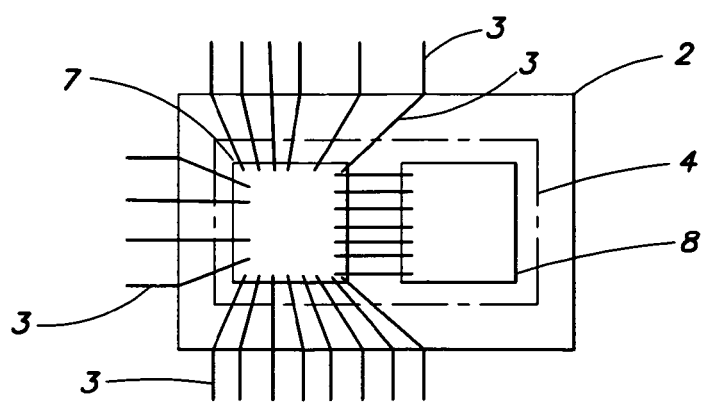
FIG. 3 is a plan view of a mount for a lateral arrangement of first and second functional units.

Referring to FIG. 3, a mount 2 has a lateral arrangement of first and second functional units 7, 8. Such a lateral arrangement of the two separate monolithic integrated circuit functional units 7, 8 may be relatively similar to the side-by-side arrangement of the two monolithic integrated circuits 5, 6 of FIG. 2. The difference may be that in FIG. 3, all external connections may be to the first functional unit 7 and the second functional unit 8 may have connections to the first functional unit 7. An exception may be a common ground connection via the platform 4. If a frame 3 is used, the mount 2 may be limited to relatively few external leads, because the wire bonds may allow a limited bonding geometry, thus compensation by the design of the internal frame leads may be partially possible. A remedy to this may be provided by the stacked arrangement of FIG. 4.

Figure 4:
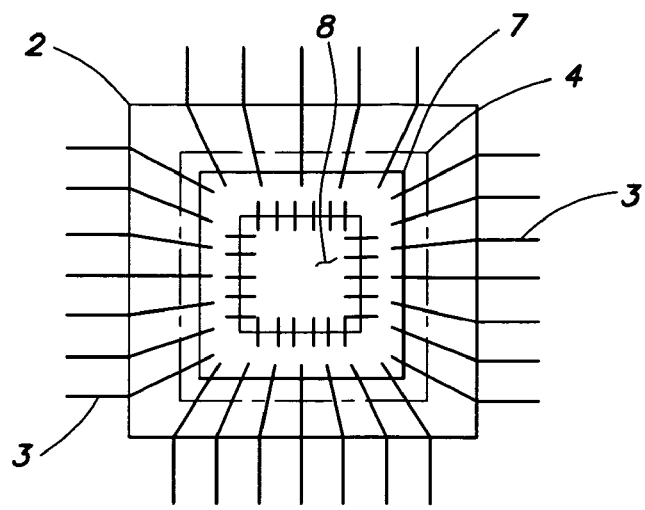
FIG. 4 is a plan view of a mount for a stacked arrangement of first and second functional units.

In the stacked arrangement of FIG. 4, two or more subcircuits or functional units 7, 8 may be located on a frame platform 4 in a central arrangement, which may allow the inner contacts of the frame 3 to be easily reached from the edge of the first functional unit 7 via bond wires. Because of the stacked arrangement, the first functional unit 7 may function as a carrier for the second functional unit 8, which may require that the chip area of the first functional unit 7 be greater than the chip area of the second functional unit 8. The package outline or the border of the plastic enclosure is represented by the line 2.

Figure 5:
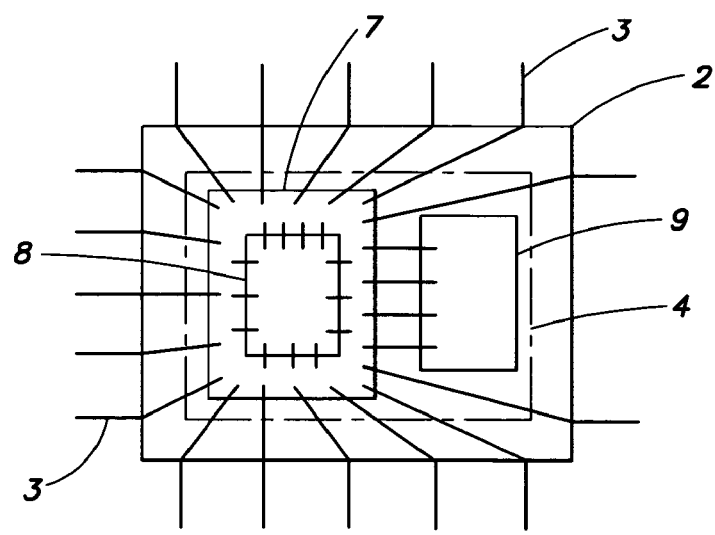
FIG. 5 is a plan view of a mount for a combination of a stacked arrangement and a lateral arrangement.

Referring to FIG. 5, an embodiment comprises a combination of a stacked arrangement and a lateral arrangement on a frame platform 4. The stacked arrangement may correspond to the stacked arrangement of FIG. 4, while the lateral arrangement may correspond to the lateral arrangement of FIG. 3. The first functional unit 7 may support the second functional unit 8 and may be connected laterally to an auxiliary unit 9 disposed on the common frame platform 4. In this embodiment, connections to the outside may be made via the first functional unit 7. The auxiliary unit 9 may be a memory module, for example, that may be connected to the second functional unit 8 by bond wires or via the first functional unit 7, depending on the spatial conditions. The package outline or the border of the plastic enclosure is represented by the line 2.

Figure 6:
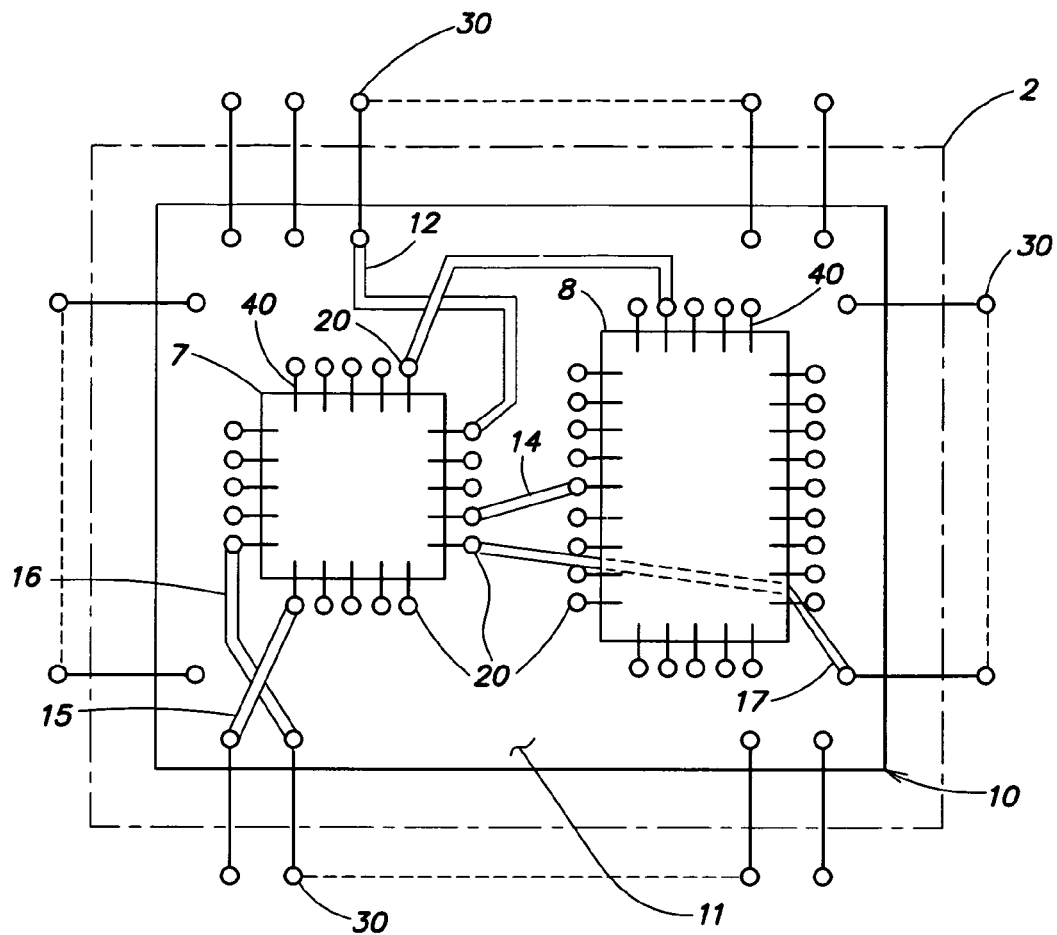
FIG. 6 is a plan view of a mount in which contacts of the first and second functional units are connected to a passive carrier.

Referring to FIG. 6, an embodiment of a mount 2 is illustrated in which a possible problem of inadequate accessibility of the external connections 30 from the first functional unit 7 may be avoided by a lateral arrangement of the first and second functional units 7, 8. An insulating carrier 10 comprising, for example, a ceramic body with an interconnection plane 11 deposited on its surface may support the first and second functional units 7, 8. The interconnection plane 11 may comprise several mutually isolated layers of wiring to form the interconnections 12-17 and associated contact areas 20. By means of the wire bonds 40, connections may be made from the first and second functional units 7, 8 to the contact areas 20 of the interconnections 12-17. The interconnections 12-17 may be isolated from each other and from the surface, and may therefore cross arbitrarily or pass below the first or second functional units 7, 8, for example, the crossover of interconnections 15, 16, and the interconnection 17, which runs below the second functional unit 8. In this manner, the external terminals 30 of the mount may be easily reached from the first functional unit 7. The carrier 10 may also be connected to the external terminals 30, or the terminals 30 may be embedded in the carrier 10 during manufacture. The entire structure may be surrounded by a plastic enclosure 2.

Figure 7:
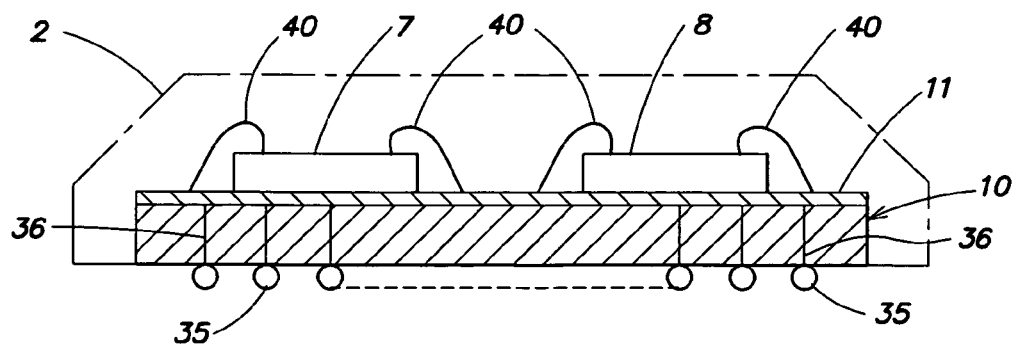
FIG. 7 is a cross-sectional view of a mount similar to FIG. 6, with the external terminals defined by an array of solder pads.

Referring to FIG. 7, a mount comprises a carrier 10 and a lateral arrangement of the first and second functional units 7, 8, which is somewhat similar to FIG. 6. The mount of FIG. 7 differs from that of FIG. 6 in that the external terminals may be defined by an array of solder pads 35. This may be used where the number of external terminals is so high that with a linear arrangement of terminals along the edges, the spacing becomes too small. Each of the solder pads 35 may be connected to a via hole 36, which may provide the electrical connection to the interconnection plane 11. In FIG. 7, the wire bonds 40 from the first and second functional units 7, 8 to the interconnection plane 11 are illustrated.

With the division of a processing device into first and second functional units 7, 8, the mount 2 may not be limited to the use of monolithic integrated circuits. If appropriate, other manufacturing processes may be used for the individual subcircuits. It suffices that when viewed from the outside, a constant electrical performance of the processing device may be maintained, which may be achieved by masking the processing device by means of a first functional unit having constant electrical parameters.

Although the present invention has been shown and described with respect to several preferred embodiments thereof, various changes, omissions and additions to the form and detail thereof, may be made therein, without departing from the spirit and scope of the invention.

What is claimed is:

1. A mount that contains a processing device which is divided into at least a first functional unit and a second functional unit, comprising:
    a carrier that supports the processing device and includes a plurality of electrically conducting signal leads that connect the processing device to a device external to the mount;
    a package that partially encapsulates the carrier and the processing device;
    where the first functional unit comprises a first die and defines input and output interfaces that connect the processing device to the device external to the mount;
    where signal connections of the second functional unit, which contains a second die, are electrically accessible from outside the mount via the first functional unit; and
    where the first functional unit includes a programmable electrical matching circuit which routes at least one signal received at the plurality of electrically conducting signal leads to the second function unit, and electrically adapts the electrical characters of the at least one signal received at the plurality of electrically conducting signals leads to electrical input signal characteristics compatible with the second functional unit and provides the electrically adapted at least one signal to the second functional unit.

2. The mount of claim 1, where the carrier comprises a support for the first and the second dies.

3. The mount of claim 1, where the carrier comprises a frame that includes connections for contact pads of at least one of the first and second dies.

4. The mount of claim 1, where at least one supply terminal of the second functional unit is fed via the first functional unit.

5. The mount of claim 1, where the carrier comprises a frame that includes a platform that receives at least one of the first and second dies.

6. The mount claim 5, where the platform includes a connection to a ground potential.

7. The mount of claim 1, where the package comprises a molded plastic package.

8. The mount of claim 1, where at least one of the matching circuits is programmable in terms of its electrical properties.

9. The mount of claim 1, where the carrier comprises a frame that includes bond wires that connect a plurality of inner leads of the frame to each of the first and second dies.

10. The mount of claim 1, where the first and second dies are arranged laterally with respect to one another.

11. The mount of claim 1, where the carrier comprises a frame.

12. The mount of claim 11, where the frame includes connections for contact pads of at least one of the first and second dies.

13. The mount of claim 11, where the frame includes a platform that receives at least one of the first and second dies.

14. The mount of claim 1, where the first and second functional units are arranged laterally.

15. The mount of claim 1, where the first and second functional units are in a stacked arraignment.

16. The mount of claim 1, further comprising an auxiliary unit, where the first and second functional units are in a stacked arrangement, where the stacked arrangement and the auxiliary unit are in a lateral arrangement.

17. The mount arrangement of claim 1, further comprising an insulating carrier having an interconnection plane, where the insulating carrier supports the first and second functional units, the interconnection plane having a plurality of mutually isolated layers of wiring that form interconnections between the first and second functional units.

18. The mount of claim 17, where the mount includes a plurality of external terminals that connect with the first functional unit.

* * * * *

UNITED STATES PATENT AND TRADEMARK OFFICE
CERTIFICATE OF CORRECTION

PATENT NO. : 7,675,165 B2  Page 1 of 1
APPLICATION NO. : 11/584377
DATED : March 9, 2010
INVENTOR(S) : Heberle et al.

It is certified that error appears in the above-identified patent and that said Letters Patent is hereby corrected as shown below:

Column 6
Line 9, after "mount" insert --of--
Line 30, delete "arraignment" and insert --arrangement--
Line 35, after "mount" delete "arrangement"

Signed and Sealed this

Thirteenth Day of April, 2010

David J. Kappos
*Director of the United States Patent and Trademark Office*